(12) United States Patent
Maneki

(10) Patent No.: US 7,151,314 B2
(45) Date of Patent: Dec. 19, 2006

(54) SEMICONDUCTOR DEVICE WITH SUPERIMPOSED POLY-SILICON PLUGS

(75) Inventor: Junya Maneki, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/989,500

(22) Filed: Nov. 17, 2004

(65) Prior Publication Data

US 2006/0103022 A1 May 18, 2006

(51) Int. Cl.
*H01L 23/48* (2006.01)

(52) U.S. Cl. .............. 257/750; 257/520; 257/756; 257/758; 257/E21.649

(58) Field of Classification Search .......... 257/520, 257/641, 644, 385, 518, 750, 756, 758, E21.649
See application file for complete search history.

(56) References Cited

U.S. PATENT DOCUMENTS

| 6,188,116 B1 * | 2/2001 | Lin ............................. 257/413 |
| 6,680,254 B1 * | 1/2004 | Sun et al. ................... 438/700 |
| 6,727,144 B1 * | 4/2004 | Hashimoto .................. 438/257 |
| 6,818,935 B1 * | 11/2004 | Kweon et al. .............. 257/295 |
| 2005/0009321 A1 * | 1/2005 | Ryu ............................ 438/624 |

* cited by examiner

*Primary Examiner*—Andy Huynh
(74) *Attorney, Agent, or Firm*—Rabin & Berdo, PC

(57) ABSTRACT

A semiconductor device includes a first insulating layer; a first poly-silicon plug formed in the first insulating layer; a second insulating layer, formed on the first insulating layer; and a second poly-silicon plug that is formed in the second insulating layer. At least one of the first and second insulating layers is made from non-doped silicate glass. The first and second poly-silicon plugs are electrically coupled to each other in a thickness direction. Preferably, both the first and second insulating layers are made from non-doped silicate glass.

9 Claims, 8 Drawing Sheets

SEMICONDUCTOR DEVICE WITH SUPERIMPOSED POLY-SILICON PLUGS

TECHNICAL FIELD OF THE INVENTION

The present invention relates to a semiconductor device; and more particularly to, a semiconductor device having superimposed poly-silicon plugs.

BACKGROUND OF THE INVENTION

Recent semiconductor devices includes a couple of poly-silicon plugs, which are superimposed in a vertical or thickness direction. Such superimposed polysilicon plugs are electrically insulated by an insulating material. According to a conventional semiconductor device, a material having a high flow rate (flow characteristic) is generally employed, such as BPSG, for the insulating material, to provide a good flatness. However, impurity, such as boron, may be diffused from the insulating material into the poly-silicon plugs. As a result, the electrical resistance of the poly-silicon plugs may be increased.

OBJECTS OF THE INVENTION

Accordingly, it is an object of the present invention to provide a semiconductor device in which the resistance of superimposed poly-silicon plugs is well controlled.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a semiconductor device includes a first insulating layer; a first poly-silicon plug formed in the first insulating layer; a second insulating layer, formed on the first insulating layer; and a second poly-silicon plug that is formed in the second insulating layer. At least one of the first and second insulating layers is made from non-doped silicate glass. The first and second poly-silicon plugs are electrically coupled to each other in a thickness direction. Preferably, both the first and second insulating layers are made from non-doped silicate glass.

The first and second insulating layers are made from non-doped silicate glass, so that it can be prevented that impurity is diffused from the insulating layers to the first and second poly-silicon plugs. As a result, the electrical resistances of the poly-silicon plugs are prevented from being undesirably increased.

According to a second aspect of the present invention, the first poly-silicon plug has a side surface which is partially exposed from the first insulating layer into the second insulating layer.

As a result of the second aspect of the present invention, better thermal efficiency can be obtained in a thermal treatment of the first poly-silicon plug, especially in a rapid thermal process (RTP). In other words, the impurity in the first poly-silicon plug can be activated quickly. Therefore, leak current of a transistor is prevented from being increased, and finer patterning can be realized. Further, a side surface of the first poly-silicon plug that is in contact with the first insulating layer is reduced. As a result, the amount of impurity that is diffused from the first poly-silicon plug into the first insulating layer in a thermal treatment is reduced. In addition, the second insulating layer is hardly removed, that is, the adhesiveness of the second insulating layer is improved.

According to a third aspect of the present invention, a semiconductor device includes a semiconductor substrate; an impurity-diffused layer, formed on the semiconductor substrate; a first insulating layer, formed on the impurity-diffused layer; a first poly-silicon plug formed in the first insulating layer; a second insulating layer, formed on the first insulating layer; a second poly-silicon plug, formed in the second insulating layer; and a conductive pattern formed on the second insulating layer. The first insulating layer is made from non-doped silicate glass, and the second insulating layer is made from impurity-doped silicate glass. The impurity-diffused layer and the conductive pattern are electrically coupled to each other in a thickness direction through the first and second poly-silicon plugs. Preferably, the second poly-silicon plug has a cross section area, which is larger than the first poly-silicon plug.

The second poly-silicon plug has a cross section area, which is larger than the first poly-silicon plug, so that the electrical resistance of the second poly-silicon plug can be decreased.

BRIEF DESCRIPTION OF THE DRAWINGS

FIGS. 2A–1H are cross-sectional views showing fabricating steps of a semiconductor device according to a second preferred embodiment of the present invention.

DETAILED DISCLOSURE OF THE INVENTION

Figure 1A:
FIGS. 1A–1G are cross-sectional views showing fabricating steps of a semiconductor device according to a first preferred embodiment of the present invention.

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

FIGS. 1A–1G are cross-sectional views showing fabricating steps of a semiconductor device according to a first preferred embodiment of the present invention. First, referring to FIG. 1G, a semiconductor device includes a semiconductor substrate 10; an impurity-diffused layer 12, formed on the semiconductor substrate 10; a first insulating layer 14, formed on the impurity-diffused layer 12; a first poly-silicon plug 16 formed in the first insulating layer 14; a second insulating layer 18, formed on the first insulating layer 14; a second poly-silicon plug 20, formed in the second insulating layer 18; and a conductive pattern 22 formed on the second insulating layer 18. The first and second insulating layers 14 and 18 are made from non-doped silicate glass. The impurity-diffused layer 12 and the conductive pattern 22 are electrically coupled to each other in a thickness direction through the first and second poly-silicon plugs 16 and 20.

Figure 1B:
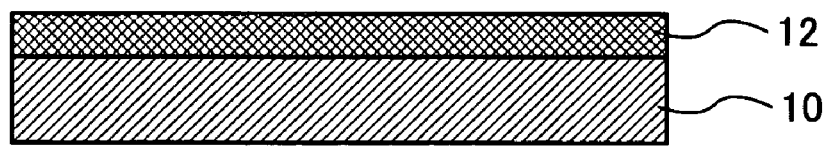
Figure 1C:
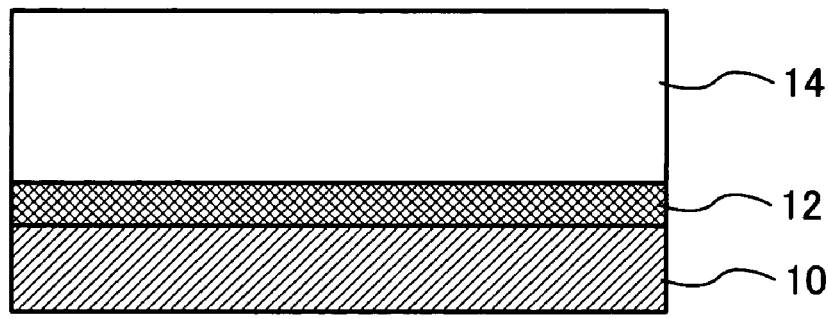
Figure 1D:
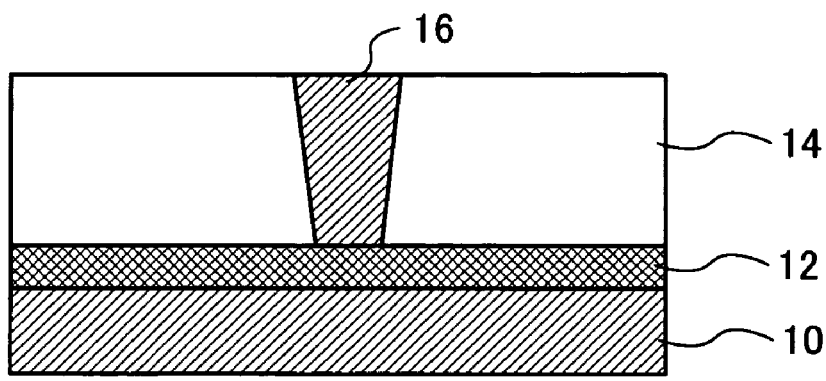

In fabrication, an impurity-diffused layer 12 is formed on a semiconductor substrate 10, as shown in FIGS. 1A and 1B, then a first insulating layer 14, which is of non-doped silicate glass, is formed on the impurity-diffused layer 12, as shown in FIG. 1C. Next, a first poly-silicon plug (contact) 16 is formed in the first insulating layer 14 so that the first poly-silicon plug 16 is in contact with an upper surface of the impurity-diffused layer 12, as shown in FIG. 1D. After that, impurity of the same conductive type as the impurity-diffused layer 12 is ion-implanted in the first poly-silicon plug 16 to provide a range in the first poly-silicon plug 16.

Figure 1E:
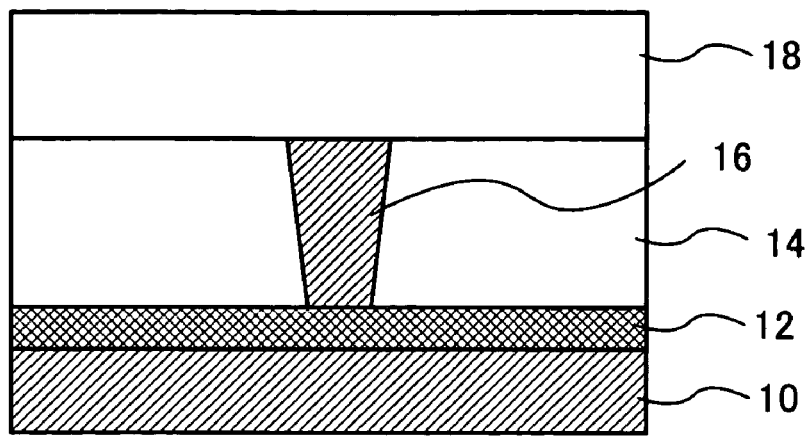
Figure 1F:
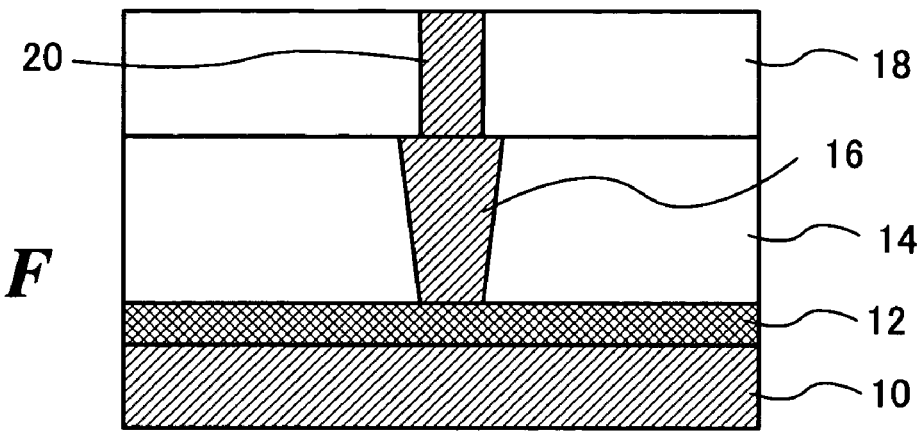
Figure 1G:
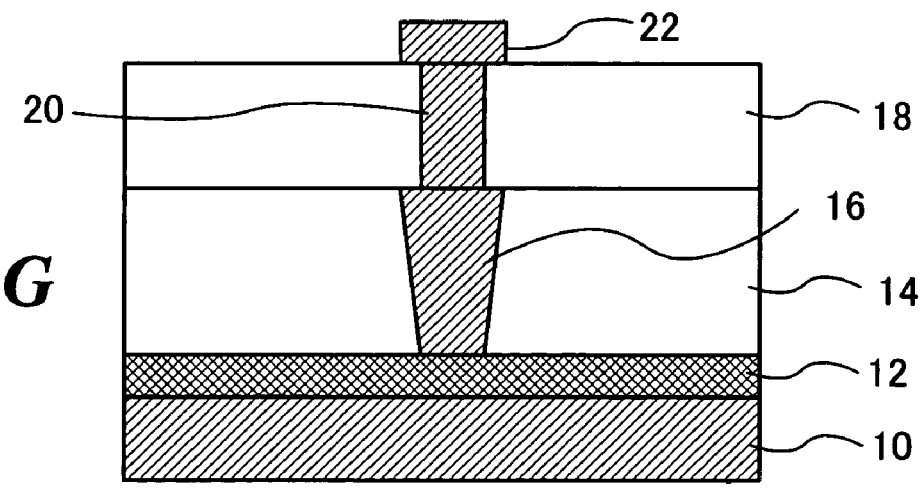

Subsequently, a thermal treatment is carried out to the substrate to activate the implanted impurity. Next, a second insulating layer 18 of non-doped silicate glass is formed over the first insulating layer 14 and the first poly-silicon plug 16, as shown in FIG. 1E. Subsequently, a second poly-silicon plug (contact) 20 is formed in the second insulating layer 18 so that a lower surface of the second poly-silicon plug 20 is in contact with an upper surface of the first poly-silicon plug 16, as shown in FIG. 1F. After that, a conductive pattern (wiring pattern) 22 is formed on the second insulating layer 18 so that an lower surface of the conductive pattern 22 is in contact with an upper surface of the second poly-silicon plug 20, as shown in FIG. 1G.

According to the thus fabricated semiconductor device, the first and second poly-silicon plugs 16 and 20 function as a device or element to connect the conductive pattern 22 to the impurity-diffused layer 12.

As described above, according to the first preferred embodiment, the first and second insulating layers 14 and 18 are made from non-doped silicate glass, so that it can be prevented that impurity is diffused from the insulating layers 14 and 18 to the first and second poly-silicon plugs 16 and 20. As a result, the electrical resistance of the poly-silicon plugs 16 and 20 are prevented from being undesirably increased. Only the first insulating layer 14 can be made from non-doped silicate glass, but the second insulating layer 18 may be made from doped silicate glass.

FIGS. 2A–2H are cross-sectional views showing fabricating steps of a semiconductor device according to a second preferred embodiment of the present invention. In FIGS. 2A–2H, the same and corresponding components to those in FIGS. 1A–1G are represented by the same reference numerals, and the same description is not repeated.

Figure 2A:
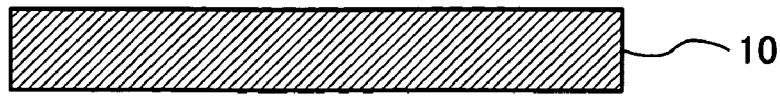
Figure 2B:
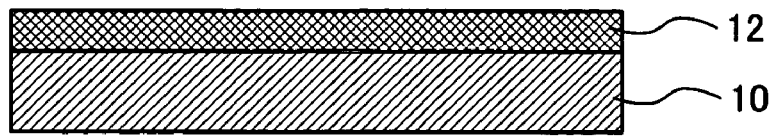
Figure 2C:
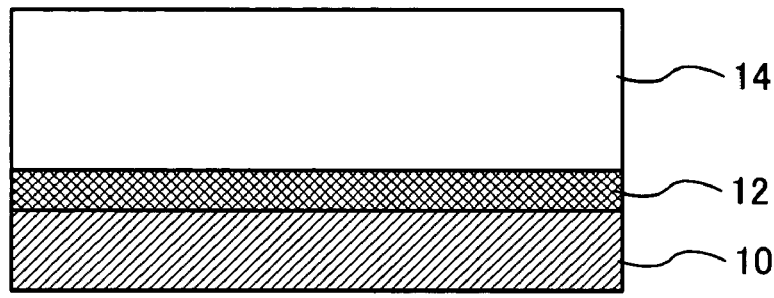
Figure 2D:
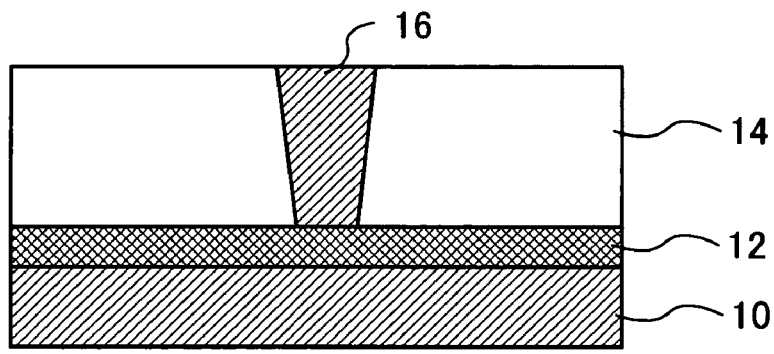
Figure 2E:
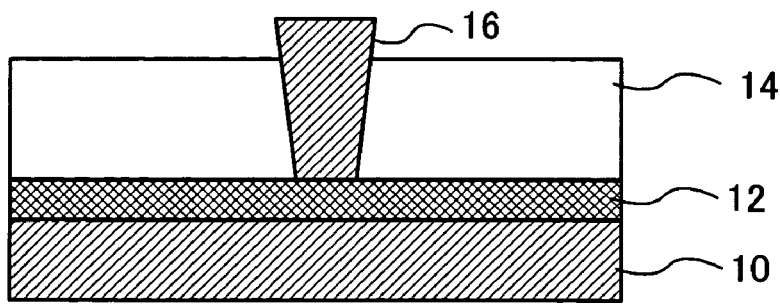
Figure 2F:
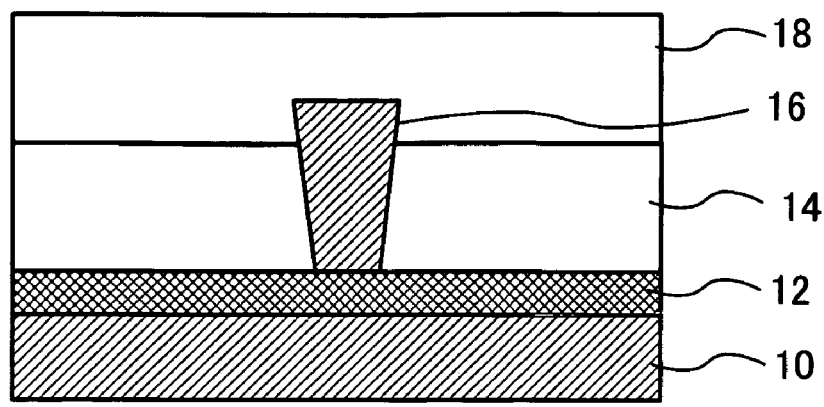
Figure 2G:
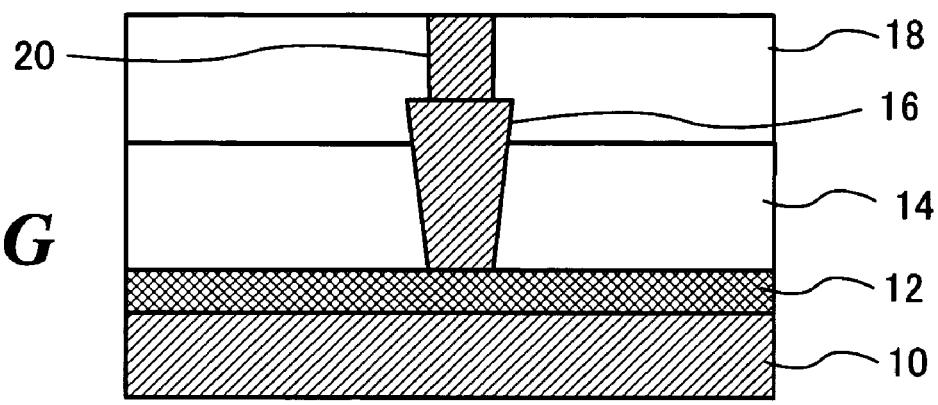
Figure 2H:
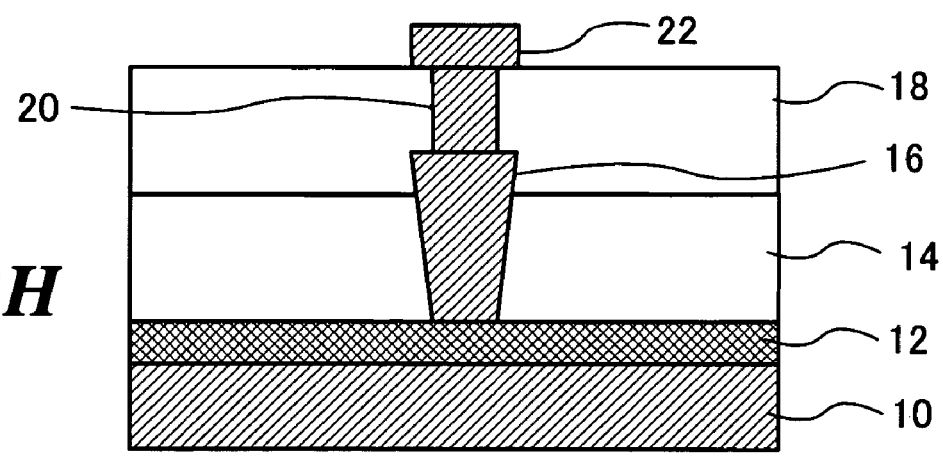

First, referring to FIG. 2H, a semiconductor device includes a semiconductor substrate 10; an impurity-diffused layer 12, formed on the semiconductor substrate 10; a first insulating layer 14, formed on the impurity-diffused layer 12; a first poly-silicon plug 16 formed in the first insulating layer 14; a second insulating layer 18, formed on the first insulating layer 14; a second poly-silicon plug 20, formed in the second insulating layer 18; and a conductive pattern 22 formed on the second insulating layer 18. The first and second insulating layers 14 and 18 are made from non-doped silicate glass. The impurity-diffused layer 12 and the conductive pattern 22 are electrically coupled to each other in a thickness direction through the first and second poly-silicon plugs 16 and 20. The first poly-silicon plug 16 has a side surface which is partially exposed from the first insulating layer 14 into the second insulating layer 18.

In fabrication, an impurity-diffused layer 12 is formed on a semiconductor substrate 10, as shown in FIGS. 2A and 2B, then a first insulating layer 14, which is of non-doped silicate glass, is formed on the impurity-diffused layer 12, as shown in FIG. 2C. Next, a first poly-silicon plug (contact) 16 is formed in the first insulating layer 14 so that the first poly-silicon plug 16 is in contact with an upper surface of the impurity-diffused layer 12, as shown in FIG. 2D.

After that, the first insulating layer 14 is ion-etched to exposed an upper portion of the first poly-silicon plug 16 is exposed, as shown in FIG. 2E. Next, impurity of the same conductive type as the impurity-diffused layer 12 is ion-implanted in the first poly-silicon plug 16 to provide a range in the first poly-silicon plug 16.

Subsequently, a thermal treatment is carried out to the substrate to activate the implanted impurity. Next, a second insulating layer 18 of non-doped silicate glass is formed over the first insulating layer 14 and the first poly-silicon plug 16, as shown in FIG. 2F. Subsequently, a second poly-silicon plug (contact) 20 is formed in the second insulating layer 18 so that a lower surface of the second poly-silicon plug 20 is in contact with an upper surface of the first poly-silicon plug 16, as shown in FIG. 2G. After that, a conductive pattern (wiring pattern) 22 is formed on the second insulating layer 18 so that an lower surface of the conductive pattern 22 is in contact with an upper surface of the second poly-silicon plug 20, as shown in FIG. 2H.

According to the thus fabricated semiconductor device, the first and second poly-silicon plugs 16 and 20 function as a device or element to connect the conductive pattern 22 to the impurity-diffused layer 12.

As described above, according to the second preferred embodiment, the first and second insulating layers 14 and 18 are made from non-doped silicate glass, so that it can be prevented that impurity is diffused from the insulating layers 14 and 18 to the first and second poly-silicon plugs 16 and 20. As a result, the electrical resistance of the poly-silicon plugs 16 and 20 are prevented from being undesirably increased. Only the first insulating layer 14 can be made from non-doped silicate glass, but the second insulating layer 18 may be made from doped silicate glass.

Further, according to the second preferred embodiment, the first poly-silicon plug 16 is partially exposed to the second insulating layer 18, so that better thermal efficiency can be obtained in a thermal treatment of the plug 16, especially in a rapid thermal process (RTP). In other words, the impurity in the first poly-silicon plug 16 can be activated quickly, as compared with the first preferred embodiment. As a result, leak current of a transistor is prevented from being increased, and finer patterning can be realized.

Further more, according to the second preferred embodiment, the first poly-silicon plug 16 is partially exposed to the second insulating layer 18, so that a side surface of the first poly-silicon plug 16 that is in contact with the first insulating layer 14 is reduced. As a result, the amount of impurity that is diffused from the first poly-silicon plug 16 into the first insulating layer 14 in a thermal treatment is reduced.

In addition, according to the second preferred embodiment, the first poly-silicon plug 16 is partially exposed to the second insulating layer 18, so that the second insulating layer 18 is hardly removed. That is, the adhesiveness of the second insulating layer is improved.

FIGS. 3A–3J are cross-sectional views showing fabricating steps of a semiconductor device according to a third preferred embodiment of the present invention. In FIGS.

3A–3J, the same and corresponding components to those in FIGS. 1A–1G and 2A–2H are represented by the same reference numerals, and the same description is not repeated.

Figure 3A:
FIGS. 3A–3J are cross-sectional views showing fabricating steps of a semiconductor device according to a third preferred embodiment of the present invention.
Figure 3B:
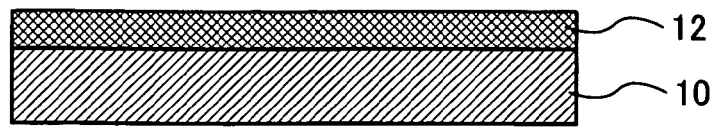
Figure 3C:
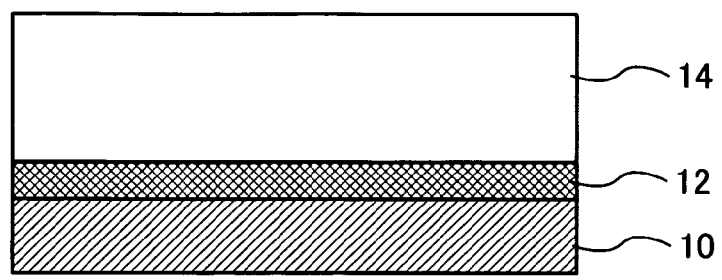
Figure 3D:
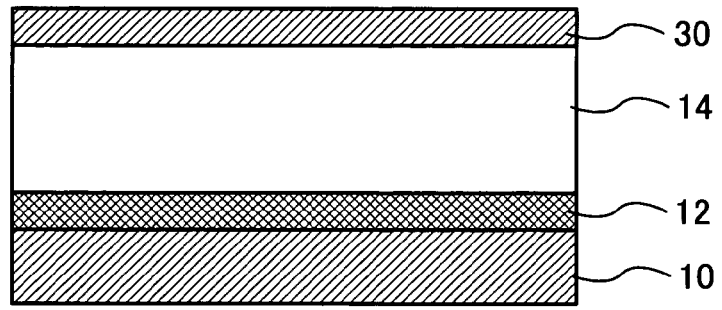
Figure 3E:
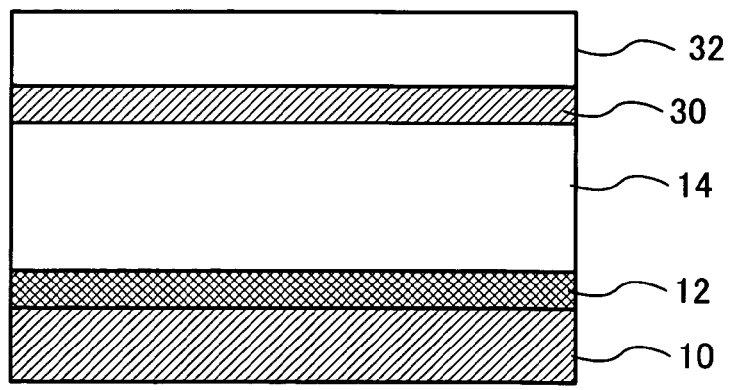
Figure 3F:
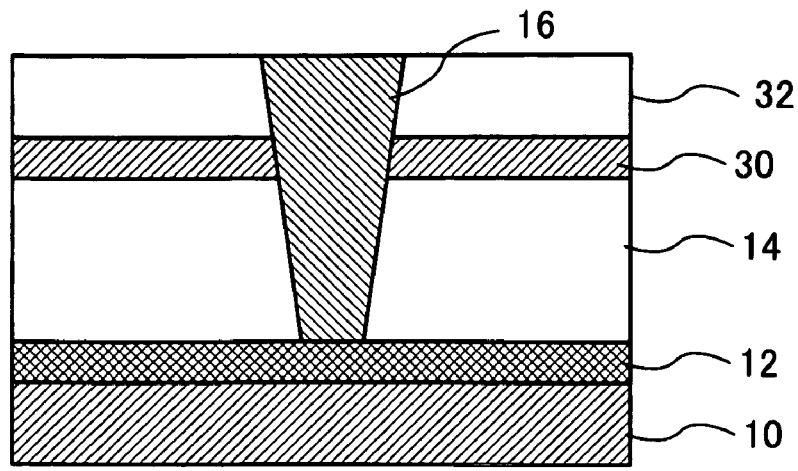
Figure 3G:
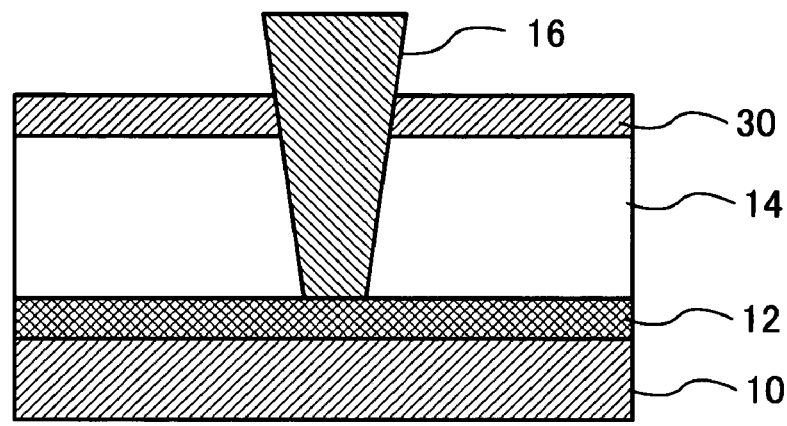
Figure 3H:
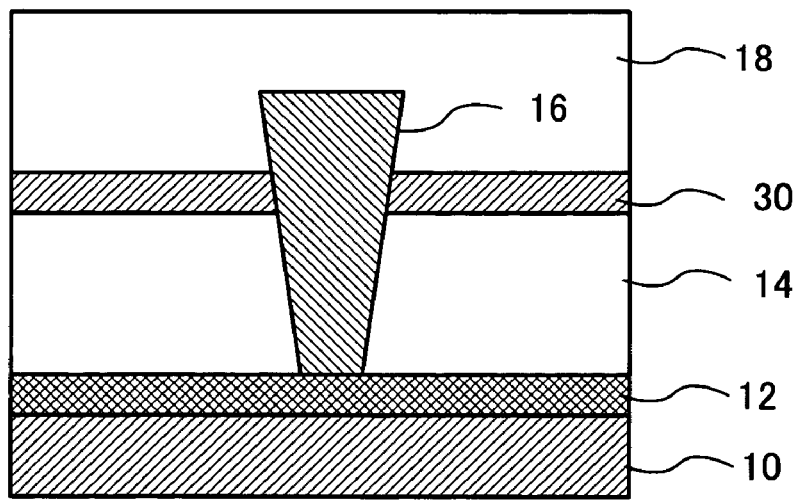
Figure 3I:
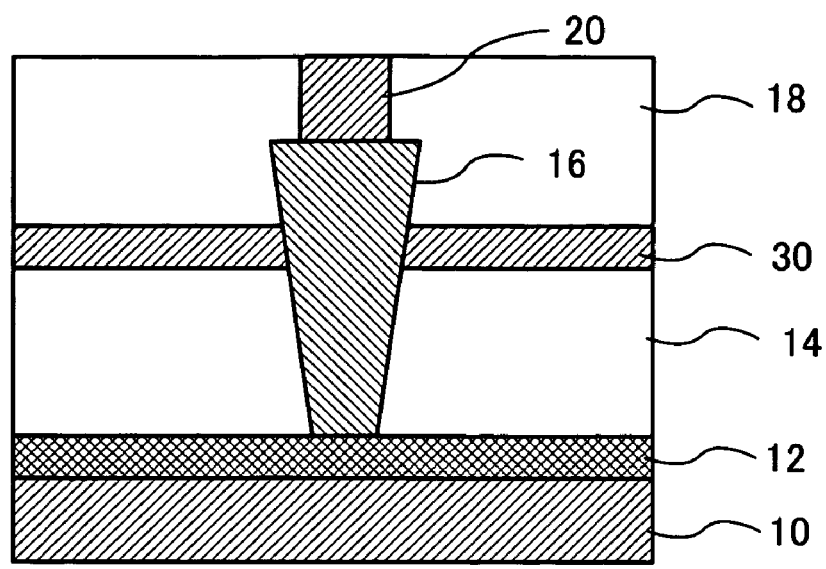
Figure 3J:
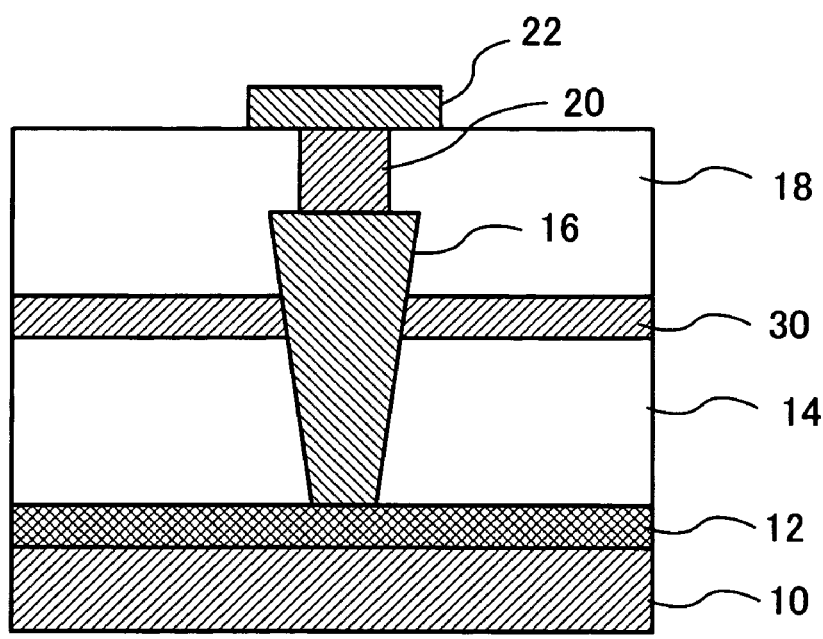

First, referring to FIG. 3J, a semiconductor device includes a semiconductor substrate 10; an impurity-diffused layer 12, formed on the semiconductor substrate 10; a first insulating layer 14, formed on the impurity-diffused layer 12; a first poly-silicon plug 16 formed in the first insulating layer 14; a second insulating layer 18, formed on the first insulating layer 14; a second poly-silicon plug 20, formed in the second insulating layer 18; a conductive pattern 22 formed on the second insulating layer 18; and a stopper layer 30 formed between the first and second insulating layers 14 and 36.

The first and second insulating layers 14 and 18 are made from non-doped silicate glass. The impurity-diffused layer 12 and the conductive pattern 22 are electrically coupled to each other in a thickness direction through the first and second poly-silicon plugs 16 and 20. The first poly-silicon plug 16 has a side surface which is partially exposed from the first insulating layer 14 into the second insulating layer 18.

In fabrication, an impurity-diffused layer 12 is formed on a semiconductor substrate 10, as shown in FIGS. 3A and 3B, then a first insulating layer 14, which is of non-doped silicate glass, is formed on the impurity-diffused layer 12, as shown in FIG. 3C. Next, a stopper layer 30, which is used in an etching process, is formed on the first insulating layer 14, as shown in FIG. 3D. The stopper layer 30 may be of Si3N4. Subsequently, an insulating layer 32 of non-dope silicate glass is formed on the stopper layer 30, as shown in FIG. 3E. Next, a first poly-silicon plug (contact) 16 is formed to pass through the first insulating layer 14, the stopper layer 30 and the insulating layer 32 so that the first poly-silicon plug 16 is in contact with an upper surface of the impurity-diffused layer 12, as shown in FIG. 3F.

After that, the insulating layer 32 is removed in an etching process so that an upper portion of the first poly-silicon plug 16 is exposed, as shown in FIG. 3G. Next, impurity of the same conductive type as the impurity-diffused layer 12 is ion-implanted in the first poly-silicon plug 16 to provide a range in the first poly-silicon plug 16 and the stopper layer 30 or the first insulting layer 14. Subsequently, a thermal treatment is carried out to the substrate to activate the implanted impurity.

Next, a second insulating layer 18 of non-doped silicate glass is formed over the stopper layer 30 and the first poly-silicon plug 16 so that side and top surface of the first poly-silicon plug 16 is covered with the second insulating layer 18, as shown in FIG. 3H. Subsequently, a second poly-silicon plug (contact) 20 is formed in the second insulating layer 18 so that a lower surface of the second poly-silicon plug 20 is in contact with an upper surface of the first poly-silicon plug 16, as shown in FIG. 3I. After that, a conductive pattern (wiring pattern) 22 is formed on the second insulating layer 18 so that an lower surface of the conductive pattern 22 is in contact with an upper surface of the second poly-silicon plug 20, as shown in FIG. 3J.

According to the thus fabricated semiconductor device, the first and second poly-silicon plugs 16 and 20 function as a device or element to connect the conductive pattern 22 to the impurity-diffused layer 12.

As described above, according to the third preferred embodiment, the first and second insulating layers 14 and 18 are made from non-doped silicate glass, so that it can be prevented that impurity is diffused from the insulating layers 14 and 18 to the first and second poly-silicon plugs 16 and 20. As a result, the electrical resistance of the poly-silicon plugs 16 and 20 are prevented from being undesirably increased. Only the first insulating layer 14 can be made from non-doped silicate glass, but the second insulating layer 18 may be made from doped silicate glass.

Further, according to the third preferred embodiment, the first poly-silicon plug 16 is partially exposed to the second insulating layer 18, so that better thermal efficiency can be obtained in a thermal treatment of the plug 16, especially in a rapid thermal process (RTP). In other words, the impurity in the first poly-silicon plug 16 can be activated quickly, as compared with the first preferred embodiment. As a result, leak current of a transistor is prevented from being increased, and finer patterning can be realized.

Furthermore, according to the third preferred embodiment, the first poly-silicon plug 16 is partially exposed to the second insulating layer 18, so that a side surface of the first poly-silicon plug 16 that is in contact with the first insulating layer 14 is reduced. As a result, the amount of impurity that is diffused from the first poly-silicon plug 16 into the first insulating layer 14 in a thermal treatment is reduced. The second insulating layer 18 is hardly removed; that is, the adhesiveness of the second insulating layer is improved.

In addition, according to the third preferred embodiment, the stopper layer 30 is formed on the first insulating layer 14, so that height of the plug can be controller precisely. The first poly-silicon plug 16 is partially exposed to the second insulating layer 18, so that the second insulating layer 18 is hardly removed. That is, the adhesiveness of the second insulating layer is improved.

Figure 4:
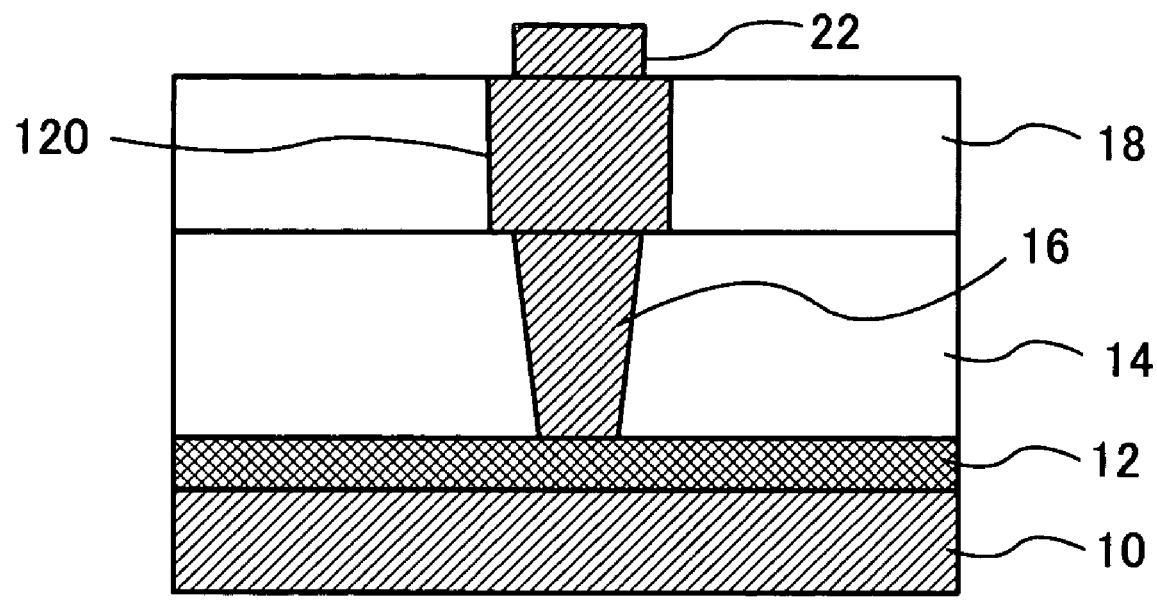
FIG. 4 is a cross-sectional view showing a semiconductor device according to a fourth preferred embodiment of the present invention.

FIG. 4 is a cross-sectional view showing a semiconductor device according to a fourth preferred embodiment of the present invention. A semiconductor device includes a semiconductor substrate 10; an impurity-diffused layer 12, formed on the semiconductor substrate 10; a first insulating layer 14, formed on the impurity-diffused layer 12; a first poly-silicon plug 16 formed in the first insulating layer 14; a second insulating layer 18, formed on the first insulating layer 14; a second poly-silicon plug 120, formed in the second insulating layer 18; and a conductive pattern 22 formed on the second insulating layer 18.

The first and second insulating layers 14 and 18 may be made from non-doped silicate glass. However, according to this embodiment, the second insulating layer 18 is made from impurity-doped silicate glass. The impurity-diffused layer 12 and the conductive pattern 22 are electrically coupled to each other in a thickness direction through the first and second poly-silicon plugs 16 and 120.

The semiconductor device, shown in FIG. 4, may be fabricated by the same steps as the first preferred embodiment. The first poly-silicon plug 16 may be formed by a step including a photo-lithograph process; an etching process; and an embedded CVD process. The second poly-silicon plug 120 has a bottom surface, the diameter of which is larger than a top surface of the first poly-silicon plug 16. In other words, the second poly-silicon plug 120 has a cross section area, which is larger than the first poly-silicon plug 16.

Generally, in a wet or dry etching process, non-dope silicate glass has an etching rate that is lower than impurity-doped silicate glass. Based on such characteristics of insulating layers 14 and 18, the second poly-silicon plug 120 can be formed to have a bottom surface, the diameter of which is larger than a top surface of the first poly-silicon plug 16. In this process, an etching treatment can be terminated at the top surface of the first insulating layer 14 by controlling conditions in an etching process to the second insulating layer 18.

As described above, according o the fourth preferred embodiment, the first insulating layer 14 is made from non-doped silicate glass, so that it can be prevented that impurity is diffused from the insulating layer 14 to the first poly-silicon plug 16. As a result, the electrical resistance of the poly-silicon plug 16 is prevented from being undesirably increased.

Further, according to the fourth preferred embodiment, the second poly-silicon plug 120 has a cross section area, which is larger than the first poly-silicon plug 16, so that the electrical resistance of the second poly-silicon plug 120 can be decreased.

What is claimed is:

1. A semiconductor device, comprising:
   a first insulating layer;
   a first polysilicon plug formed in the first insulating layer;
   a second insulating layer, formed on the first insulating layer; and
   a second poly-silicon plug that is formed entirely in the second insulating layer, wherein
   at least one of the first and second insulating layers is made from non-doped silicate glass,
   the first and second poly-silicon plugs are electrically coupled to each other in a thickness direction,
   both the first and second insulating layers are made from non-doped silicate glass, and
   the first and second poly-silicon plugs are formed only in the first and second insulating layers, to thereby prevent impurities from being diffused to the first and second poly-silicon plugs.

2. A semiconductor device according to claim 1, wherein the first poly-silicon plug has a side surface which is partially exposed from the first insulating layer into the second insulating layer.

3. A semiconductor device according to claim 1, wherein the second poly-silicon plug has a cross section area, which is larger than the first poly-silicon plug.

4. A semiconductor device according to claim 1, further comprising:
   a semiconductor substrate;
   an impurity-diffused layer, formed on the semiconductor substrate; and
   a conductive pattern formed on the second insulating layer; wherein
   the first insulating layer is formed on the impurity diffused layer; and
   the impurity-diffused layer and the conductive pattern are electrically coupled to each other in a thickness direction through the first and second poly-silicon plugs.

5. A semiconductor device, comprising:
   a semiconductor substrate;
   an impurity-diffused layer, formed on the semiconductor substrate;
   a first insulating layer, formed on the impurity-diffused layer;
   a first poly-silicon plug formed in the first insulating layer;
   a second insulating layer, formed on the first insulating layer;
   a second poly-silicon plug, formed entirely in the second insulating layer; and
   a conductive pattern formed on the second insulating layer, wherein
   the first and second insulating layers are made from non-doped silicate glass,
   the impurity-diffused layer and the conductive pattern are electrically coupled to each other in a thickness direction through the first and second poly-silicon plugs, and
   the first and second poly-silicon plugs are formed only in the first and second insulating layers, to thereby prevent impurities from being diffused to the first and second poly-silicon plugs.

6. A semiconductor device according to claim 5, wherein the first poly-silicon plug has a side surface which is partially exposed from the first insulating layer into the second insulating layer.

7. A semiconductor device according to claim 5, wherein the second poly-silicon plug has a cross section area, which is larger than the first poly-silicon plug.

8. A semiconductor device, comprising:
   a semiconductor substrate;
   an impurity-diffused layer, formed on the semiconductor substrate;
   a first insulating layer, formed on the impurity diffused layer;
   a first poly-silicon plug formed in the first insulating layer;
   a second insulating layer, formed on the first insulating layer;
   a second poly-silicon plug, formed entirely in the second insulating layer; and
   a conductive pattern formed on the second insulating layer, wherein
   the first insulating layer is made from non-doped silicate glass, and the second insulating layer is made from impurity-doped silicate glass,
   the impurity-diffused layer and the conductive pattern are electrically coupled to each other in a thickness direction through the first and second poly-silicon plugs, and
   the first and second poly-silicon plugs are formed only in the first and second insulating layers, to thereby prevent impurities from being diffused to the first and second poly-silicon plugs.

9. A semiconductor device according to claim 8, wherein the second poly-silicon plug has a cross section area, which is larger than the first poly-silicon plug.

* * * * *